United States Patent
Tseng et al.

(10) Patent No.: US 7,573,971 B2
(45) Date of Patent: Aug. 11, 2009

(54) SHIFT REGISTER CIRCUIT AND PULL HIGH ELEMENT THEREOF

(75) Inventors: Ming-Chun Tseng, Tainan County (TW); Hong-Ru Guo, Tainan County (TW); Chien-Hsiang Huang, Tainan County (TW)

(73) Assignees: Chi Mei Optoelectronics Corp., Tainan County (TW); Chi Mei El Corporation, Tainan County (TW)

( * ) Notice: Subject to any disclaimer, the term of this patent is extended or adjusted under 35 U.S.C. 154(b) by 98 days.

(21) Appl. No.: 11/743,336

(22) Filed: May 2, 2007

(65) Prior Publication Data

US 2007/0258557 A1     Nov. 8, 2007

(30) Foreign Application Priority Data

May 4, 2006    (TW) ............................... 95115951 A

(51) Int. Cl.
*G11C 19/00*    (2006.01)

(52) U.S. Cl. .............................. 377/64; 377/68; 377/69; 377/70

(58) Field of Classification Search .................. 377/64, 377/68–70, 73–75, 77–81
See application file for complete search history.

(56) References Cited

U.S. PATENT DOCUMENTS

| | | | | |
|---|---|---|---|---|
| 6,339,631 | B1 * | 1/2002 | Yeo et al. | 377/64 |
| 7,027,550 | B2 * | 4/2006 | Lin | 377/64 |
| 2005/0220263 | A1 * | 10/2005 | Moon | 377/68 |

* cited by examiner

*Primary Examiner*—Tuan Lam

(57) ABSTRACT

A shift register circuit has a plurality of shift registers connected in series, each shift register having a phase-shifting element and a pull-high element, wherein the phase-shifting element receives a first input signal, a first clock signal and a second clock signal, and the first clock signal and the second clock signal are complementary in phase. The pull-high element is used for pulling up an output signal to a high logic level, and includes a logic unit, wherein no current path is established in the pull-high element when the shift register is operated in any type of periods.

13 Claims, 10 Drawing Sheets

SHIFT REGISTER CIRCUIT AND PULL HIGH ELEMENT THEREOF

RELATED APPLICATIONS

The present application is based on, and claims priority from, TW Application Number 95115951, filed May 4, 2006, the disclosure of which is hereby incorporated by reference herein in its entirety.

TECHNICAL FIELD

This disclosure relates to a shift register circuit, and more particularly, to a shift register circuit used in a thin film transistor plane display.

BACKGROUND

With advantages of compact size, light weight, high image quality, low driving voltage, and low power consumption, thin film transistor plane displays have been widely used in electrical products such as portable computers, mobile phones, personal digital assistants, and color televisions, and have become the mainstream display apparatus.

The driving system of the thin film transistor plane display comprises source drivers and scan drivers, and the source drivers and the scan drivers include shift register circuits composed of a plurality of shift registers connected in series. Reference is made to FIG. 1 illustrating a diagram of a conventional PMOS (P-Channel Metal Oxide Semiconductor) shift register. The conventional shift register comprises a phase-shifting element 110 and a pull-high element 120. The phase-shifting element 110 is coupled to an input 112, a first clock node C1 and a second clock node C2, wherein the input 112, the first clock node C1 and the second clock node C2 are used for receiving an input signal, a first clock signal and a second clock signal, respectively. The pull-high element 120 is coupled to the phase-shifting element 110 and an output 124, and the output 124 outputs an output signal. The phase-shifting element 110 comprises a first transistor MP1 and a second transistor MP2, and the pull-high element 120 comprises an inverter 122 and a third transistor MP3. The drain of the first transistor MP1 and the gate of the second transistor MP2 are coupled to the input of the inverter 122 as a first node VX, and the output of the inverter 122 is coupled to the gate of the third transistor MP3 as a second node VY. The drain of the third transistor MP3 is coupled to a first voltage source (VDD) of high logic level. The output 124 is located on the node (not shown) of the drain of the second transistor MP2 and the source of the third transistor MP3. There is a boost capacitor (C_boost) between the first node VX and the second clock node C2.

The main function of the inverter 122 in the pull-high element 120 is to provide a proper logic level for the third transistor MP3 to enable the third transistor MP3 to output a proper signal of high logic level. Reference is made to FIGS. 2a, 2b, 3a, and 3b. FIGS. 2a and 3a illustrate diagrams of the structure of two types of the conventional inverters. FIGS. 2b and 3b illustrate timing diagrams of the two types of the conventional inverters. Input signals 210 and 226 are inputted to the two types of the conventional inverters, and the two types of the conventional inverters output signals 212 and 228, respectively. Since single transistor technique is used in the embodiments of the two types of the conventional inverters, when input signals 210 and 226 are of low logic level, the transistors 204 and 220 in the two types of the inverters are turned on to generate drain current signals 214 and 230. When the transistors 204 and 220 are under small signal analysis in AC voltage, there is drain-source resistance rds (not shown), so a current path is generated resulting in power consumption.

Moreover, the logic levels of the node signals of the first node VX and the second node VY may not be high enough to cut off the second transistor MP2 or the third transistor MP3. Or, the logic levels of the node signals of the first node VX and the second node VY may not be low enough to turn on the second transistor MP2 or the third transistor MP3. Thus results in the malfunctions of the second transistor MP2 or the third transistor MP3, which makes the conventional inverter generate wrong output signals.

Therefore, it is necessary to propose a method for the shift register circuit to solve the problem of power consumption described above, and further to enable the shift register circuit to output proper signals of high or low logic level without resulting in the malfunctions of the elements.

SUMMARY

Therefore, an aspect of the present invention is to provide a shift register circuit to solve the power consumption problem resulting from the current path by preventing generating any current path in any operation cycle and further to save power.

Another aspect of the present invention is to provide a shift register circuit to prevent the shift register circuit from generating wrong output signals by bucking the output of the shift register circuit to a proper (low enough) signal of low logic level or boosting the output of the shift register circuit to a proper (high enough) signal of high logic level.

In an embodiment, the present invention provides a shift register circuit composed of a plurality of shift registers connected in series. Each shift register comprises a phase-shifting element and a pull-high element. The phase-shifting element is coupled to a first input, a first clock node and a second clock node, wherein the first input, the first clock node and the second clock node receives a first input signal, a first clock signal and a second clock signal, respectively. The first clock signal and the second clock signal are complementary in phase. The pull-high element is coupled to the phase-shifting element and an output. The pull-high element is used for pulling up an output signal of the output to a high logic level, wherein the pull-high element comprises a logic unit, and the logic unit has at least two inputs coupled to the phase-shifting element. No current path is established in the logic unit when the first input signal is logic low. The phase-shifting element determines a first node signal according to the first input signal and the first clock signal. The pull-high element determines a second node signal according to a second input signal, the first node signal and the second clock signal, and the output signal is determined by the first node signal and the second node signal.

In a further embodiment, the present invention provides a pull-high element coupled to an output. The pull-high element is used for pulling up an output signal of the output to a high logic level. The pull-high element comprises a logic unit, a third transistor and a fourth transistor. The logic unit is used for receiving a first node signal and a second clock signal. The logic level of the first node signal inputted to the logic unit is controlled by the first clock signal and an input signal. The second clock signal and a first clock signal are complementary in phase. No current path is established in the logic unit and the fourth transistor when the first node signal is logic low. The gate of the third transistor is coupled to a second node, and the second node is coupled to the logic unit. The drain of the third transistor is coupled to a first voltage source (VDD) of high logic level, and the source of the third transistor is coupled to the output. The drain of the fourth transistor is coupled to the second node, the source of the fourth transistor is coupled to a second voltage source (VSS) of low logic level, and the gate of the fourth transistor is coupled to a second input used for receiving a second input signal.

BRIEF DESCRIPTION OF THE DRAWINGS

The foregoing aspects and many of the attendant advantages of embodiments of this invention will become more readily appreciated as the same becomes better understood by reference to the following detailed description, when taken in conjunction with the accompanying drawings, wherein.

DETAILED DESCRIPTION OF EMBODIMENTS

A feature of the shift register circuit in accordance with embodiments of the present invention is that by the complement in the phases of the first clock signal and the second clock signal, no current path is established in the shift register circuit in embodiments of the present invention during any input condition of operation, and thus the conventional problem of power consumption is solved.

Figure 1:
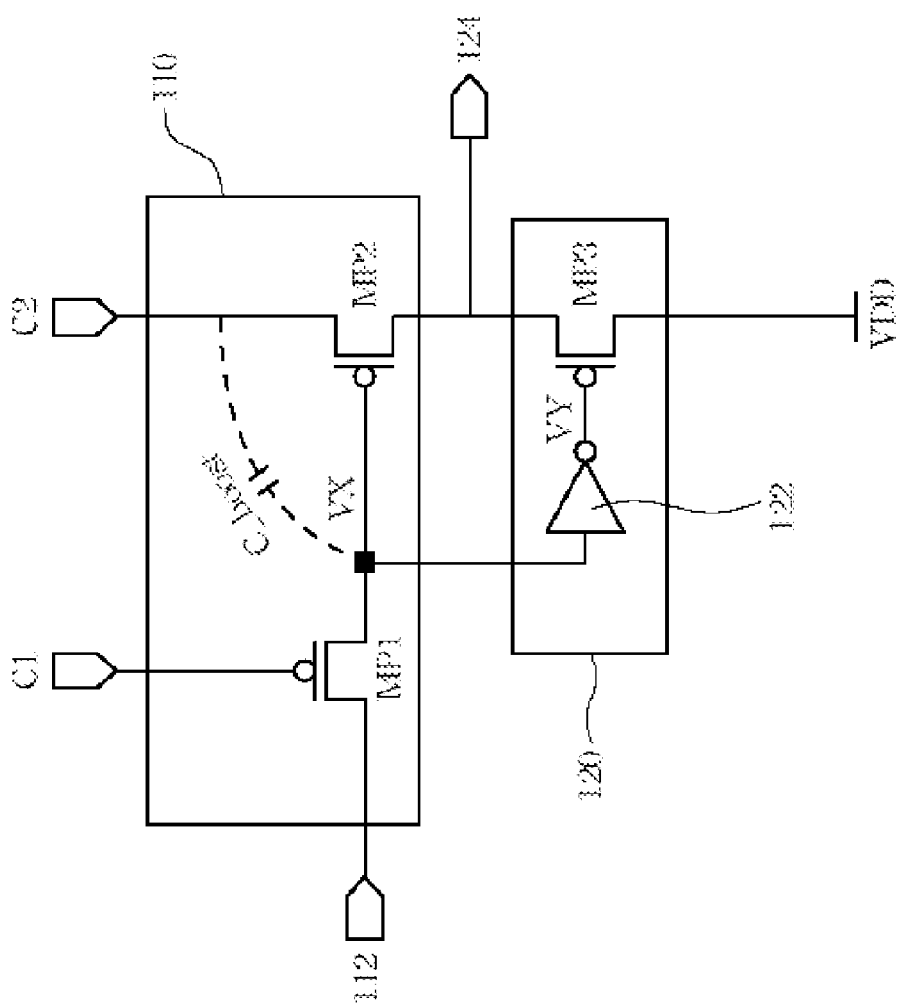
FIG. 1 illustrates a diagram of a conventional PMOS shift register.
Figure 2A:
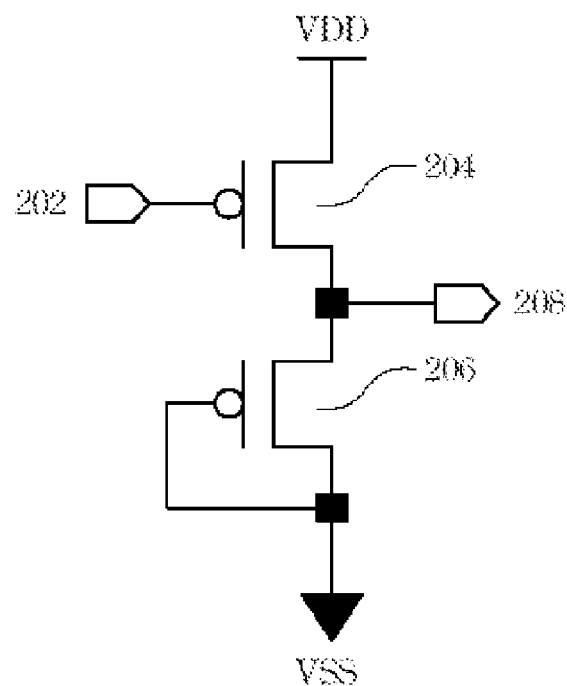
FIG. 2a illustrates a diagram of the structure of a conventional inverter.
Figure 2B:
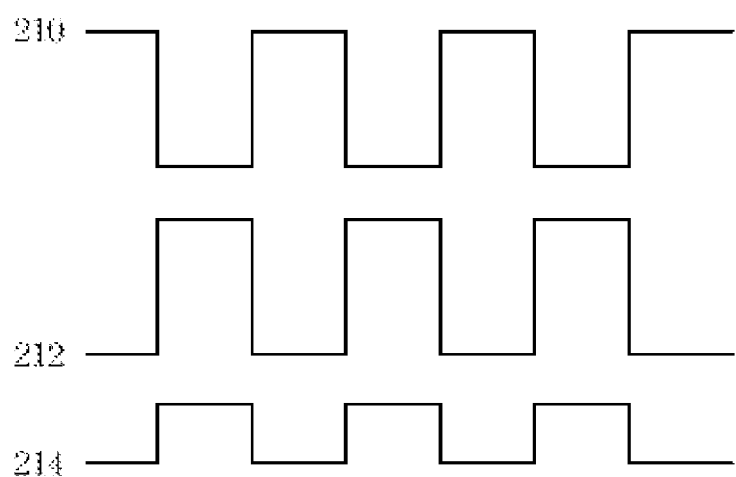
FIG. 2b illustrates a timing diagram of the conventional inverter.
Figure 3A:
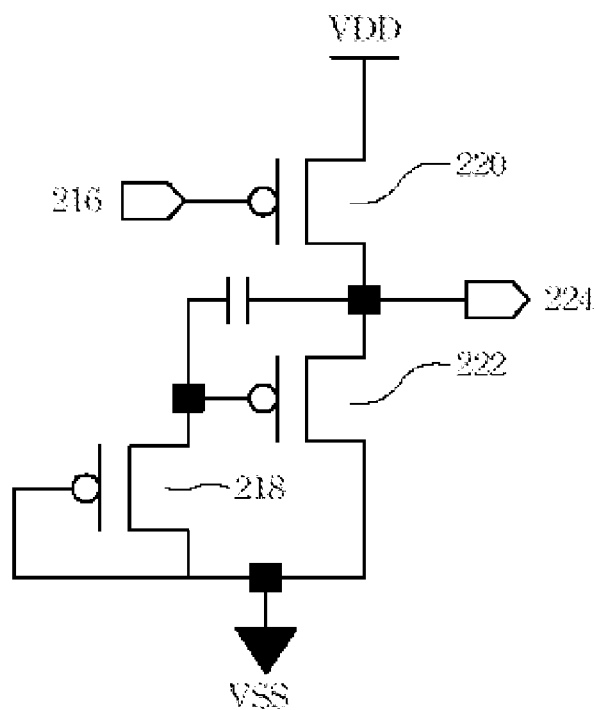
FIG. 3a illustrates a diagram of the structure of another conventional inverter.
Figure 3B:
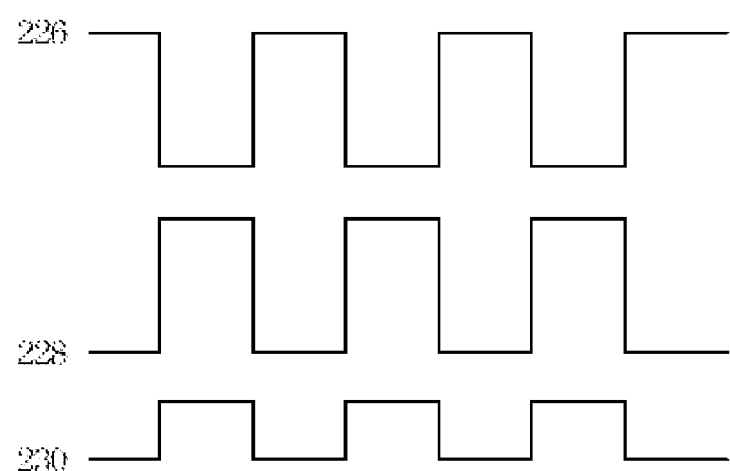
FIG. 3b illustrates a timing diagram of the conventional inverter.
Figure 4:
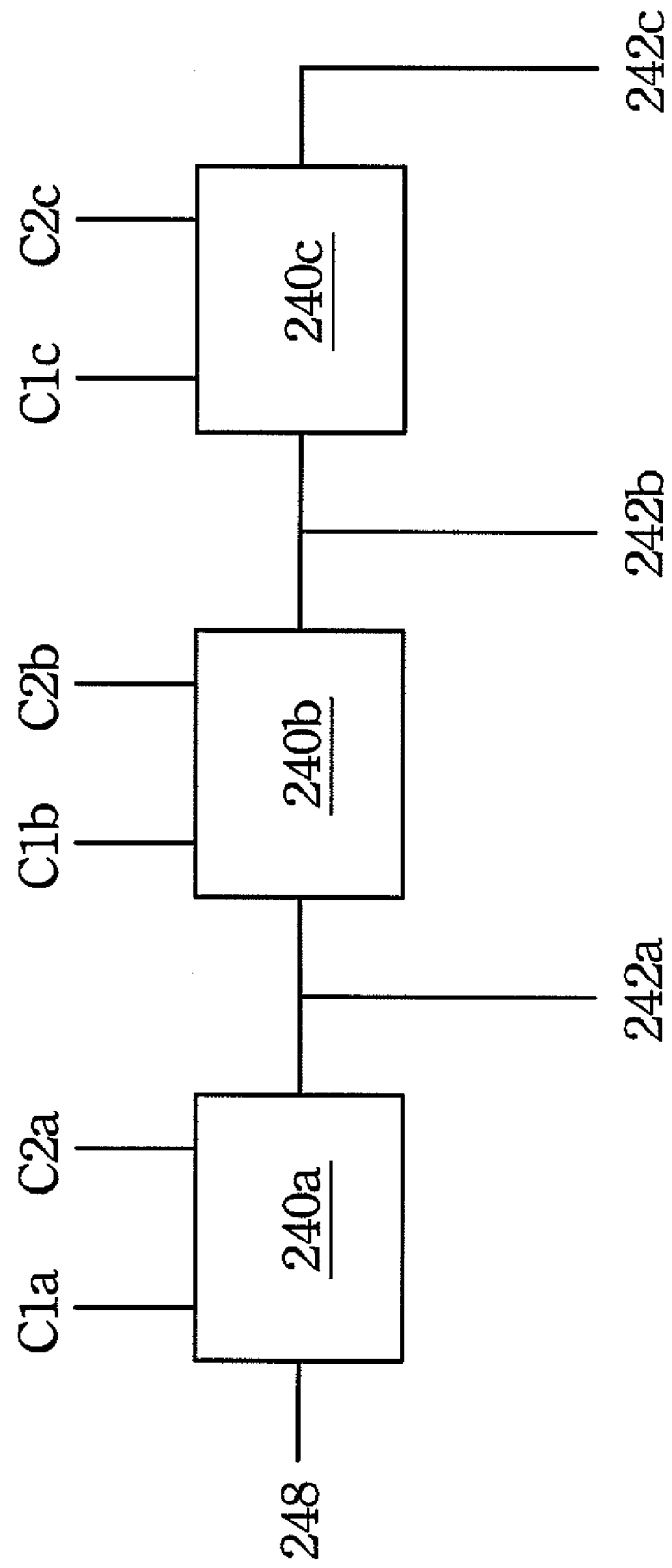
FIG. 4 illustrates a block diagram of a shift register circuit according to an embodiment of the present invention.

Reference is made to FIG. 4 illustrating a block diagram of a shift register circuit according to an embodiment of the present invention. The shift register circuit is composed of a plurality of shift registers (240a, 240b, 240c) connected in series, and each shift register (240a, 240b or 240c) is coupled to a first clock node (C1a, C1b or C1c) and a second clock node (C2a, C2b or C2c), and outputs an output signal to an output (242a, 242b or 242c), respectively. The shift register 240a is coupled to an input 248, and the input signals of the shift registers 240b and 240c are the output signals of the former shift register, i.e. the input signal of the shift register 240b is the output signal at the output 242a of the shift register 240a, and the input signal of the shift register 240c is the output signal at the output 242b of the shift register 240b. However, that three shift registers connected in series in FIG. 4 in the preferred embodiment of the present invention are just an example and are not intended to be limiting. Other amount of shift registers can be connected in series in the shift register circuit of the present invention.

Figure 5:
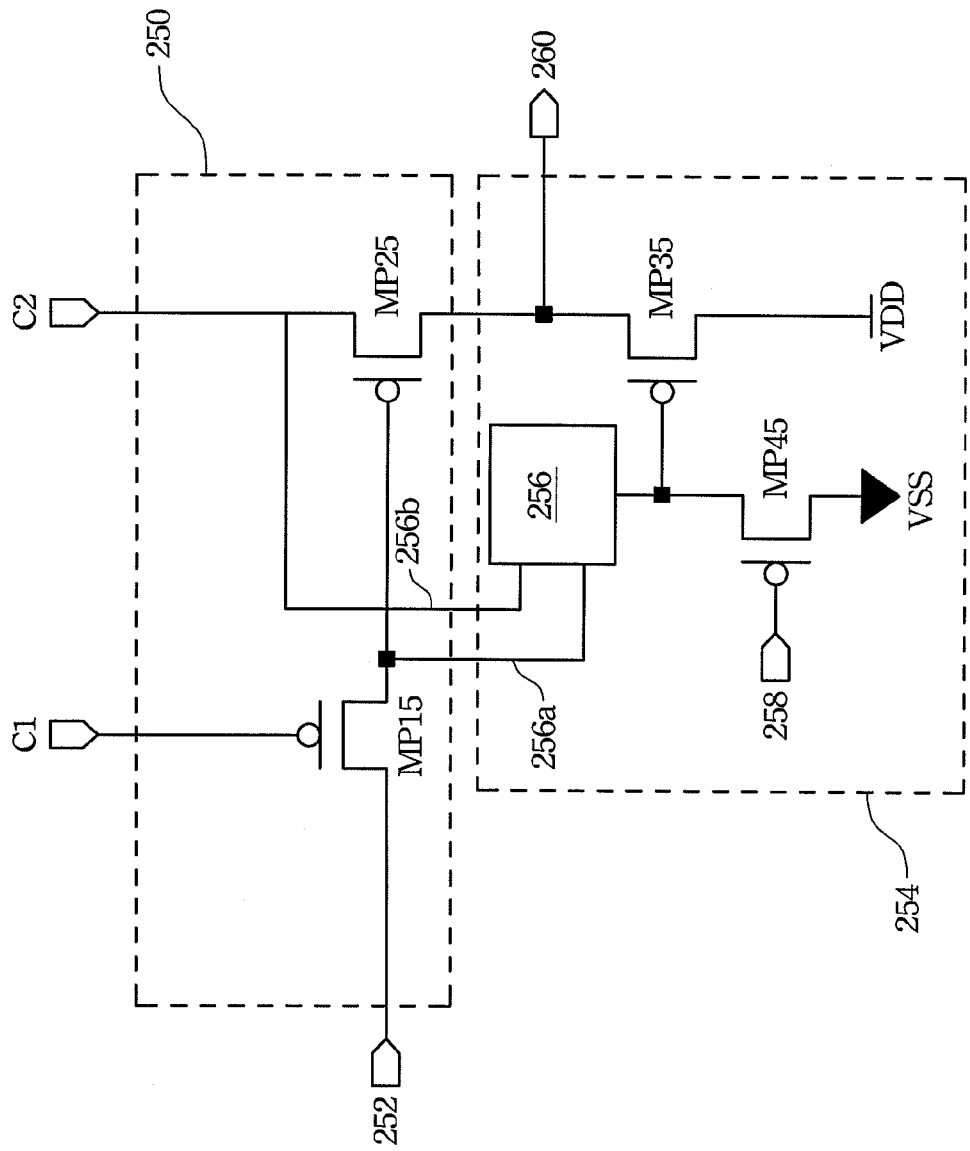
FIG. 5 illustrates a circuit diagram of the shift register shown in FIG. 4.

Reference is made to FIG. 5 illustrating a circuit diagram of the shift register shown in FIG. 4. The shift register comprises a phase-shifting element 250 and a pull-high element 254, wherein the phase-shifting element 250 is coupled to a first input 252, a first clock node C1 and a second clock node C2, and the pull-high element 254 is coupled to the phase-shifting element 250 and an output 260. The phase-shifting element 250 may further comprise a first transistor MP15 and a second transistor MP25.

The pull-high element 254 is used for pulling up an output signal of the output 260 to a high logic level, wherein the pull-high element 254 comprises a logic unit 256 and a second input 258, and the logic unit 256 has at least two inputs 256a and 256b coupled to the phase-shifting element 250. The pull-high element 254 further comprises a third transistor MP35 and a fourth transistor MP45.

Figure 7:
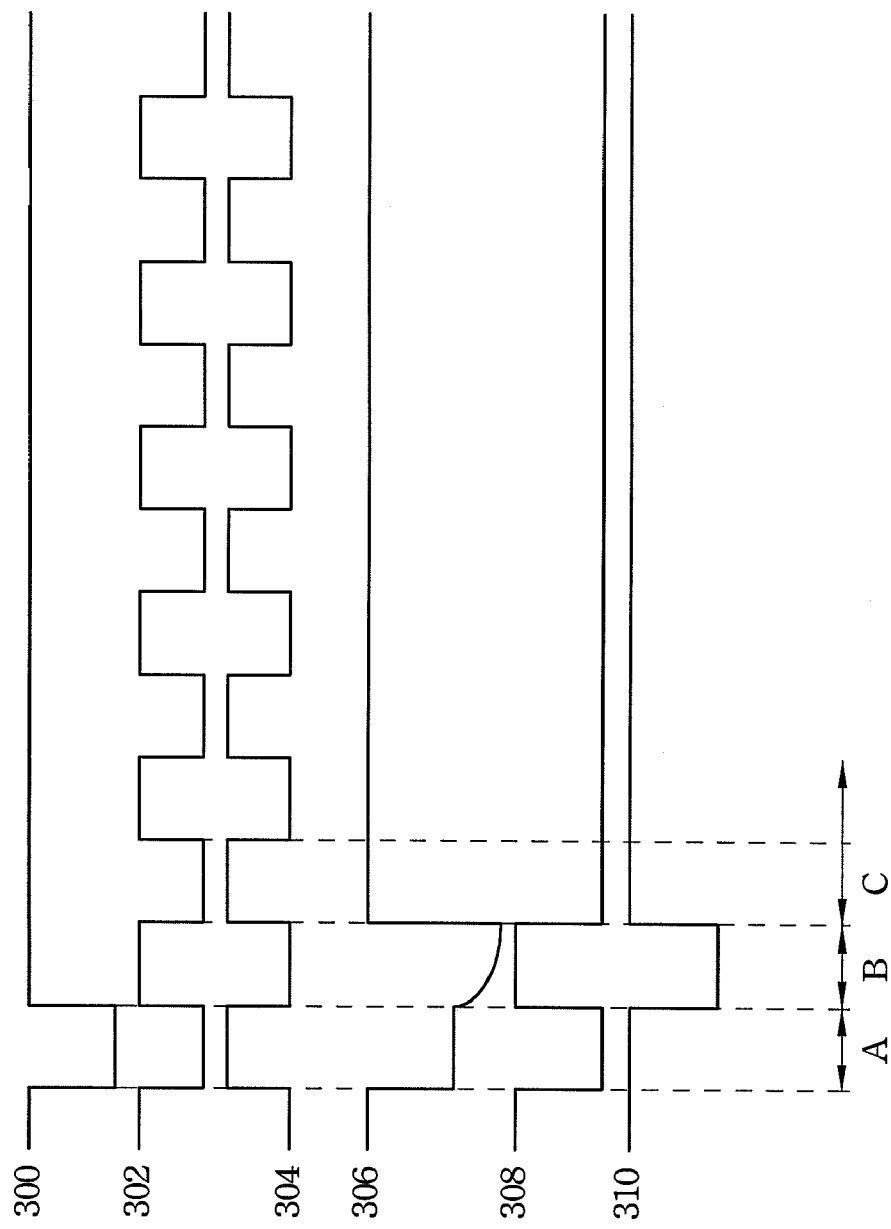
FIG. 7 illustrates a timing diagram of the shift register.

Reference is made to FIG. 7 illustrating a timing diagram of the shift register. The first input 252, the first clock node C1, the second clock node C2, and the output 260 receives a first input signal 300, a first clock signal 302, a second clock signal 304, and the output signal 310, respectively. The first clock signal 302 and the second clock signal 304 in the present invention are complementary in phase as shown in FIG. 7.

Two examples are described as follows to describe the above mentioned preferred embodiment in detail.

Figure 6:
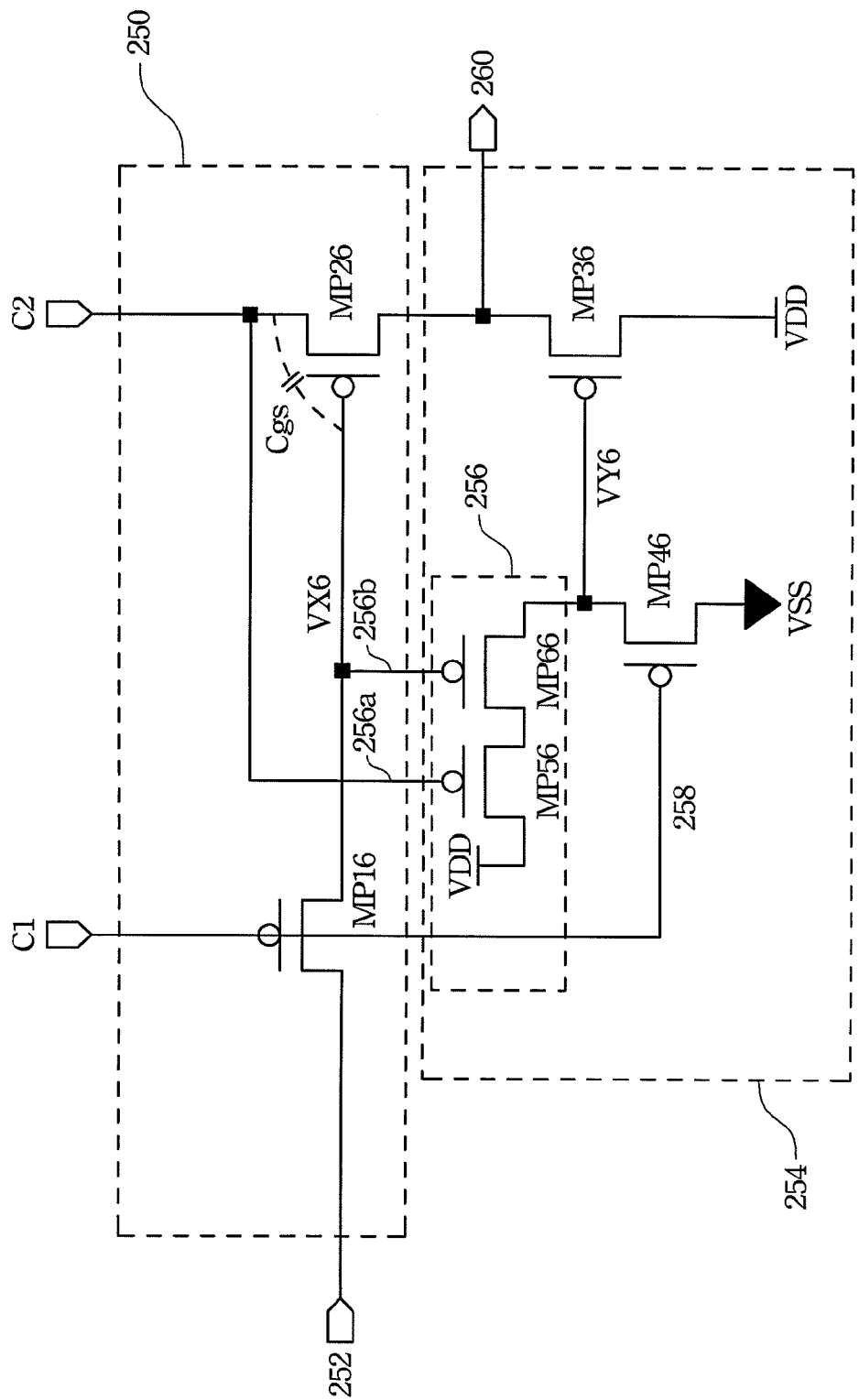
FIG. 6 illustrates a circuit diagram of an example of the shift register shown in FIG. 5.

Reference is made to FIG. 6 illustrating a circuit diagram of an example of the shift register shown in FIG. 5. All of the transistors in the example are PMOS transistors. However, the transistors in the shift register may also be NMOS (N-Channel Metal Oxide Semiconductor) transistors. The distribution of the voltage source can be properly modified according to NMOS transistors, so it is not intended to limit the present invention. The shift register in the example comprises a phase-shifting element 250 and a pull-high element 254, wherein the phase-shifting element 250 is coupled to a first input 252, a first clock node C1, and a second clock node C2, and the phase-shifting element 250 comprises a first transistor MP16 and a second transistor MP26. The drain of the first transistor MP16 is coupled to the gate of the second transistor MP26 as a first node VX6. The signal on the first node VX6 is the first node signal 306, and the level of the first node signal 306 is determined by the first input signal 300 and the first clock signal 302. The first transistor MP16 is used for receiving the first clock signal 302 at the first clock node C1 and the first input signal 300 at the first input 252. The second transistor MP26 is used for receiving the second clock signal 304 at the second clock node C2 and the first node signal 306 at the first node VX6.

The pull-high element 254 comprises a logic unit 256, a third transistor MP36 and a fourth transistor MP46. In this example, the logic unit 256 is a NAND gate, and the circuit to embody the NAND gate comprises a fifth transistor MP56 and a sixth transistor MP66. The fifth transistor MP56 is coupled to the sixth transistor MP66 as shown in FIG. 6. However, the circuit to embody the NAND gate is just for explanation, and the present invention is not limited to the structure. The drain of the fifth transistor MP56 is coupled to a first voltage source (VDD) of high logic level, the source of the fifth transistor MP56 is coupled to the source of the sixth transistor MP66, and the gate of the fifth transistor MP56 and the gate of the sixth transistor MP66 are coupled to the two inputs 256a and 256b of the phase-shifting element 250. The second clock signal 304 at the second clock node C2 and the first node signal 306 at the first node VX6 are inputted to the logic unit 256 via the two inputs 256a and 256b. The drain of the sixth transistor MP66 is coupled to the drain of the fourth transistor MP46 and the gate of the third transistor MP36 as a second node VY6. The signal on the second node VY6 is the second node signal 308. The second node signal 308 is determined by a first clock signal 302 at the second input 258, the first node signal 306 and the second clock signal 304. The source of the fourth transistor MP46 is coupled to a second voltage source (VSS) of low logic level. The gate of the fourth transistor MP46 is the second input 258. In this example, the second input 258 is coupled to the first clock node C1. The source of the third transistor MP36 is coupled to the output 260 and the drain of the second transistor MP26, and the drain of the third transistor MP36 is coupled to the first voltage source (VDD) of high logic level. The output 260 outputs an output signal 310, and it is determined by the first node signal 306 and the second node signal 308.

The pull-high element 254 in the present invention may further be used in any kind of shift registers, and it is not intended to limit the present invention.

The following describes in detail how the shift register works by reference to FIG. 7.

In Cycle A:

When the first input signal 300 is logic low (L), the first clock signal 302 is logic low (L) and the second clock signal 304 is logic high (H), the turning on or off of each of the transistors, the levels of the first node signal 306, and the second node signal 308 are shown in Table 1, wherein L+ means logic low (L) plus (+) the threshold voltage (Vth) of the transistor.

sistor MP66 are not turned on simultaneously. Therefore, no current path is established in the pull-high element 254 when the input signal is logic low. That is, the power consumption problem of the conventional shift register can be solved by using the shift register of the present invention.

Figure 8A:
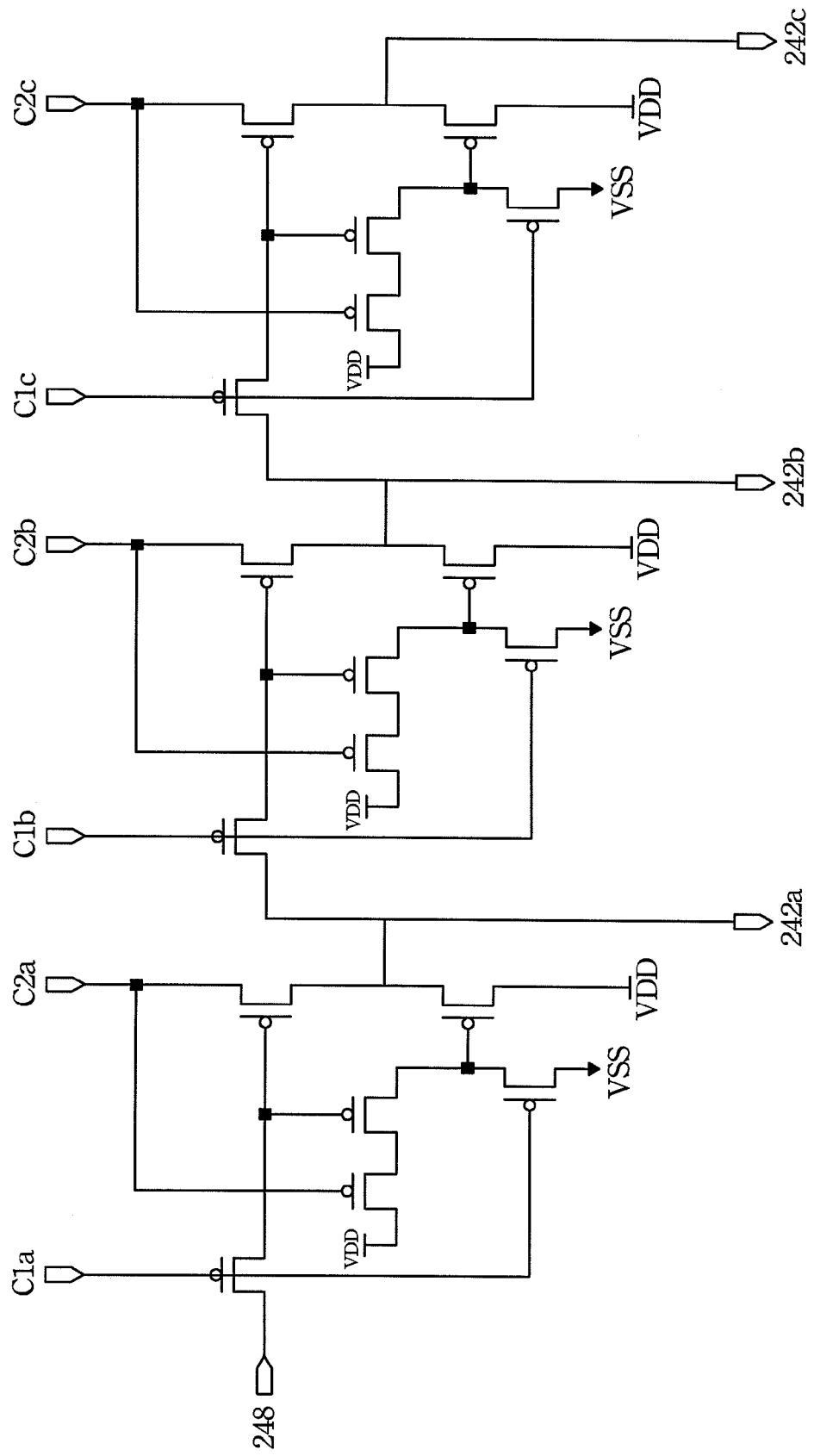
FIG. 8a illustrates a circuit diagram of the shift register circuit of an embodiment of the present invention.
Figure 8B:
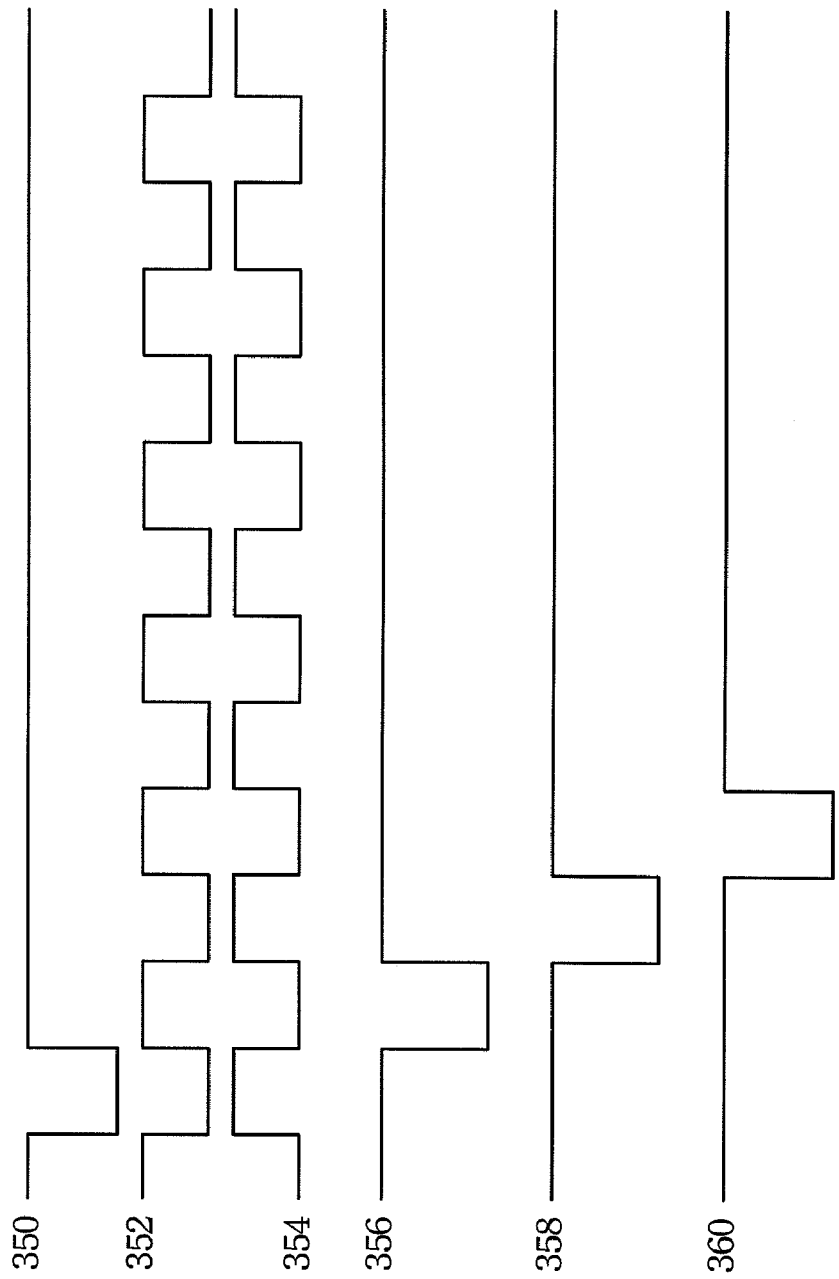
FIG. 8b illustrates a waveform of the multi-stage shift register circuit of an embodiment of the present invention.

Furthermore, a plurality of shift registers of the present invention can be connected in series to form the shift register circuit of the present invention, as shown in FIG. 8a illustrating a circuit diagram of the shift register circuit of the present invention. FIG. 8a is also the circuit diagram of the shift register circuit in FIG. 4. Reference is made to FIG. 8b illustrating a waveform of the multi-stage shift register circuit of

TABLE 1

| | The first input signal | The first clock signal | The second clock signal | MP16 | MP26 | MP36 | MP46 | MP56 | MP66 | VX6 | VY6 | The output signal |
|---|---|---|---|---|---|---|---|---|---|---|---|---|
| Cycle A | L | L | H | ON | ON | ON | ON | OFF | ON | L+ | L+ | H |

In Cycle B:

When the first input signal 300 is logic high (H), the first clock signal 302 is logic high (H) and the second clock signal 304 is logic low (L), the turning on or off of each of the transistors, the levels of the first node signal 306 and the second node signal 308 are shown in Table 2, wherein there is a parasitic capacitor (Cgs) between the first node VX6 and the source of the second transistor MP26, and it is buck to voltage Δ t. The voltage Δ t is determined according to the divided voltage of the amount of the parasitic capacitors connected in series to the parasitic capacitor (Cgs) of the second transistor MP26. L− means that:

$$L-=\text{logic low }(L)+Vth-\Delta t.$$

It can be derived that if the logic level of the first node signal 306 is low enough, then the second transistor MP26 will not malfunction.

the present invention. An input signal 350, a first clock signal 352 and a second clock signal 354 are inputted to the shift register circuit via an input 248, a first clock node (C1a, C1b, C1c, etc) and a second clock node (C2a, C2b, C2c, etc), respectively, to generate shifted output signals 356, 358, and 360.

Figure 9:
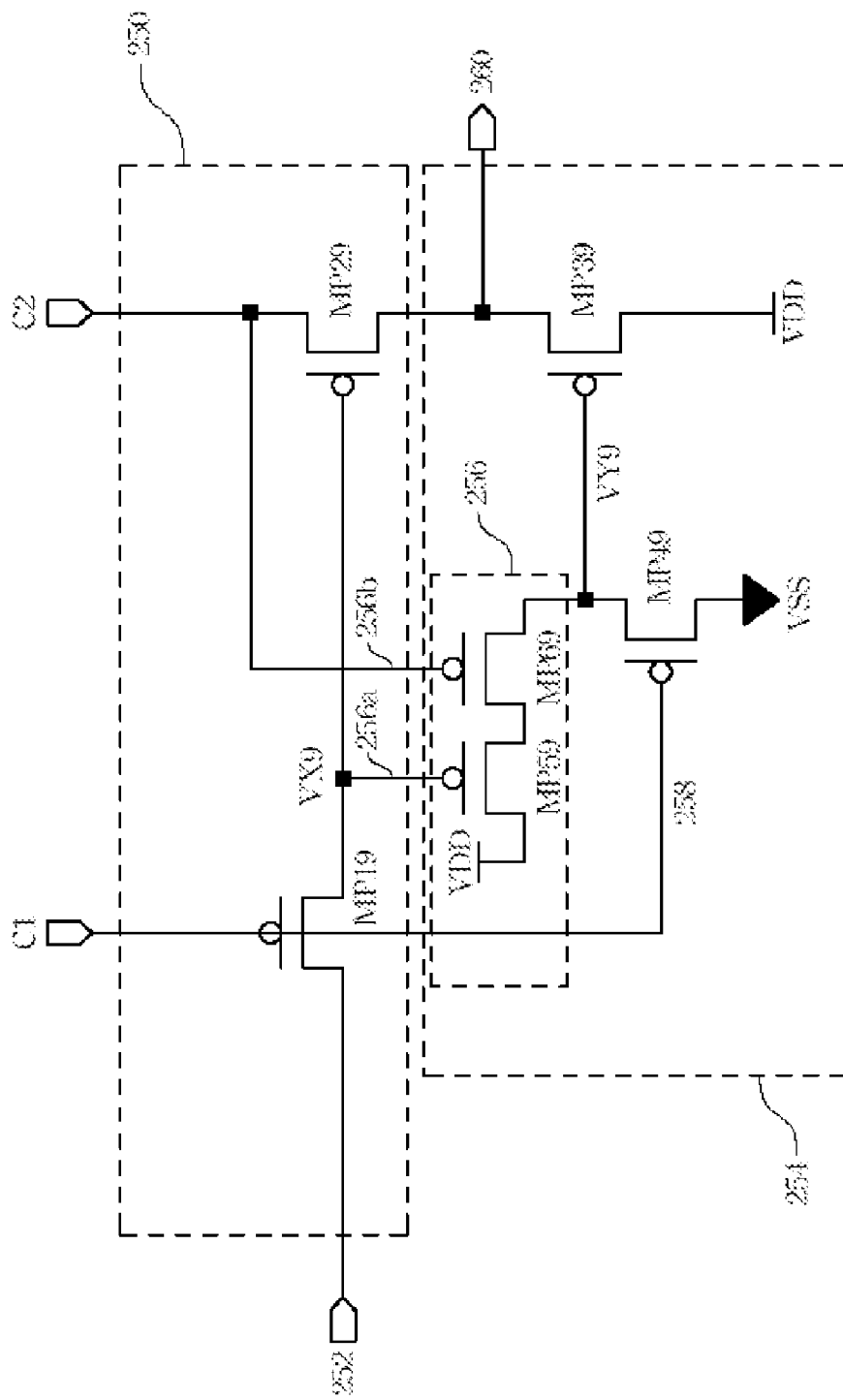
FIG. 9 illustrates a circuit diagram of another example of the shift register shown in FIG. 5.

The following describes another example of the present invention. Reference is made to FIG. 9 illustrating a circuit diagram of another example of the shift register shown in FIG. 5.

All of the transistors in the example are PMOS transistors. As mentioned above, the transistors in the shift register may also be NMOS (N-Channel Metal Oxide Semiconductor) transistors. The distribution of the voltage source can be properly modified according to NMOS transistors, so it is not intended to limit the present invention. The shift register in the

TABLE 2

| | The first input signal | The first clock signal | The second clock signal | MP16 | MP26 | MP36 | MP46 | MP56 | MP66 | VX6 | VY6 | The output signal |
|---|---|---|---|---|---|---|---|---|---|---|---|---|
| Cycle B | H | H | L | OFF | ON | OFF | OFF | ON | ON | L− | H | L |

In Cycle C:

When the first input signal 300 is logic high (H), the first clock signal 302 is logic low (L) and the second clock signal 304 is logic high (H), the turning on or off of each of the transistors, the levels of the first node signal 306, and the second node signal 308 are shown in Table 3.

example comprises a phase-shifting element 250 and a pull-high element 254, wherein the phase-shifting element 250 is coupled to a first input 252, a first clock node C1 and a second clock node C2, and the phase-shifting element 250 comprises a first transistor MP19 and a second transistor MP29. The drain of the first transistor MP19 is coupled to the gate of the

TABLE 3

| | The first input signal | The first clock signal | The second clock signal | MP16 | MP26 | MP36 | MP46 | MP56 | MP66 | VX6 | VY6 | The output signal |
|---|---|---|---|---|---|---|---|---|---|---|---|---|
| Cycle C | H | L | H | ON | OFF | ON | ON | OFF | OFF | H | L+ | H |

It is known from any operation cycle above that the fourth transistor MP46, the fifth transistor MP56 and the sixth transecond transistor MP29 as a first node VX9. The first transistor MP19 is used for receiving the first clock signal at the first clock node C1 and the first input signal at the first input 252. The second transistor MP29 is used for receiving the second clock signal at the second clock node C2 and the first node signal at the first node VX9.

The pull-high element 254 comprises a logic unit 256, a third transistor MP39 and a fourth transistor MP49. In this example, the logic unit 256 is a NAND gate, and the circuit to embody the NAND gate comprises a fifth transistor MP59 and a sixth transistor MP69 as shown in FIG. 9. However, the circuit to embody the NAND gate is just for explanation, and the present invention is not limited to the structure. The drain of the fifth transistor MP59 is coupled to a first voltage source (VDD) of high logic level, the source of the fifth transistor MP59 is coupled to the source of the sixth transistor MP69, and the gate of the fifth transistor MP59 and the gate of the sixth transistor MP69 are coupled to the two inputs 256a and 256b of the phase-shifting element 250. The first node signal at the first node VX9 and the second clock signal at the second clock node C2 are inputted to the two inputs 256a and 256b. The drain of the sixth transistor MP69 is coupled to the drain of the fourth transistor MP49 and the gate of the third transistor MP39 as a second node VY9. The signal on the second node VY9 is the second node signal. The logic level of the second node signal is determined by a first clock signal at the second input 258, the first node signal and the second clock signal. The source of the fourth transistor MP49 is coupled to a second voltage source (VSS) of low logic level. The gate of the fourth transistor MP49 is the second input 258. In this example, the second input 258 is coupled to the first clock node C1. The source of the third transistor MP39 is coupled to the output 260 and the drain of the second transistor MP29, and the drain of the third transistor MP39 is coupled to the first voltage source (VDD) of high logic level. The output 260 outputs an output signal, and it is determined by the first node signal and the second node signal. The pull-high element 254 in the present invention may also be used in any kind of shift registers, and it is not intended to limit the present invention.

The principle of how the shift register in the second example of the present invention works is similar to that in the first example, so the detail is omitted here.

According to the aforementioned description, one advantage of the shift register circuit in the present invention is that the fourth transistor, the fifth transistor and the sixth transistor are not turned on simultaneously no matter the shift register is operated in any operation cycle. Therefore, no current path is established in the pull-high element 254. That is, the power consumption problem of the conventional can be solved by using the shift register of the present invention.

According to the aforementioned description, yet another advantage of the shift register circuit in the present invention is that the wrong output signal due to the indefinite logic level of the signal can be prevented.

As is understood by a person skilled in the art, the foregoing preferred embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A shift register circuit, comprising a plurality of shift registers connected in series, each said shift register comprising:

a phase-shifting element, coupled to a first input, a first clock node and a second clock node, wherein the first input, the first clock node and the second clock node receive a first input signal, a first clock signal and a second clock signal, respectively, and the first clock signal and the second clock signal are complementary in phase; and a pull-high element, coupled to the phase-shifting element and an output, for pulling up an output signal of the output to a high logic level, wherein the pull-high element comprises a logic unit, and the logic unit has at least two inputs coupled to the phase-shifting element;

wherein no current path is established in the logic unit when the first input signal is at a low logic level;

the phase-shifting element is configured to determine a first node signal at a first node according to the first input signal and the first clock signal;

the pull-high element is configured to determine a second node signal at a second node according to a second input signal, the first node signal and the second clock signal, and to determine the output signal by the first node signal and the second node signal;

the pull-high element further comprises first, second and third transistors having sources and drains connected in series in the recited order;

the third and second transistors together define the logic unit;

the second node is between the first and second transistors;

a gate of the first transistor is connected to receive the second input signal;

a gate of the third transistor is connected to the second clock node; and a gate of the second transistor is connected to the first node.

2. The shift register circuit as claimed in claim 1, wherein the phase-shifting element of each said shift register comprises:

a fourth transistor having a source and a drain connected between the first input and the first node, and a gate connected to the first clock node; and a fifth transistor having a source and a drain connected between the second clock node and the output, and a gate connected to the first node for receiving the first node signal that determines whether the fifth transistor is turned on or off.

3. The shift register circuit as claimed in claim 2, wherein the type of transistor of all the transistors is one selected from the group consisting of: PMOS (P-Channel Metal Oxide Semiconductors) and NMOS (N-Channel Metal Oxide Semiconductors).

4. The shift register circuit as claimed in claim 1, wherein the logic unit of each said shift register is a NAND gate.

5. The shift register circuit as claimed in claim 2, wherein the pull-high element of each said shift register further comprises:

a sixth transistor;

wherein a gate of the sixth transistor is coupled to the second node, a drain of the sixth transistor is coupled to a first voltage source (VDD) of the high logic level, and a source of the sixth transistor is coupled to the output.

6. The shift register circuit as claimed in claim 5, wherein the gate of the first transistor is connected to the first clock node to receive the first clock signal as the second input signal.

7. The shift register circuit as claimed in claim 5, wherein the type of transistor of all the transistors is one selected from the group consisting of: PMOS (P-Channel Metal Oxide Semiconductors) and NMOS (N-Channel Metal Oxide Semiconductors).

8. A pull-high element for pulling up an output signal at an output of the pull-high element to a high logic level, the pull-high element comprising:

first, second and third transistors having sources and drains connected in series in the recited order; and a fourth transistor;

wherein the third and second transistors together define a logic unit;

a second node is defined between the first and second transistors;

a gate of the first transistor is connected to receive a second input signal;

a gate of the third transistor is connected to receive a second clock signal;

a gate of the second transistor is connected to receive a first node signal that is determined by a first input signal and a first clock signal;

the second clock signal and the first clock signal are complementary in phase, no current path is established in the logic unit and the first transistor when the first node signal is at a low logic level;

a gate of the fourth transistor is coupled to the second node for receiving a second node signal, a drain and a source of the fourth transistor are coupled between a first voltage source (VDD) of a high logic level and the output, a source of the first transistor is coupled to a second voltage source (VSS) of the low logic level.

9. The pull-high element as claimed in claim 8, wherein the logic unit is a NAND gate.

10. The pull-high element as claimed in claim 8, wherein the type of transistor of all the transistors is one selected from the group consisting of: PMOS (P-Channel Metal Oxide Semiconductors) and NMOS (N-Channel Metal Oxide Semiconductors).

11. The pull-high element as claimed in claim 8, wherein the gate of the first transistor is connected to receive the first clock signal as the second input signal.

12. The pull-high element as claimed in claim 11, wherein the type of transistor of all the transistors is one selected from the group consisting of: PMOS (P-Channel Metal Oxide Semiconductors) and NMOS (N-Channel Metal Oxide Semiconductors).

13. The pull-high element as claimed in claim 8, wherein the pull-high element is a pull-high element of in a shift register circuit.

* * * * *